United States Patent [19]
Yallup

[11] Patent Number: 5,627,401
[45] Date of Patent: May 6, 1997

[54] BIPOLAR TRANSISTOR OPERATING METHOD WITH BASE CHARGE CONTROLLED BY BACK GATE BIAS

[76] Inventor: Kevin J. Yallup, 81 Monaleen Park, Limerick, Ireland

[21] Appl. No.: 559,504

[22] Filed: Nov. 15, 1995

Related U.S. Application Data

[60] Continuation of Ser. No. 307,296, Sep. 14, 1994, abandoned, which is a division of Ser. No. 88,173, Jul. 7, 1993, Pat. No. 5,448,104.

[51] Int. Cl.$^6$ .......................... H01L 27/01; H01L 27/12; H01L 29/00
[52] U.S. Cl. ................ 257/557; 257/347; 257/526
[58] Field of Search ..................... 257/526, 557, 257/558, 576, 583, 584, 585, 593, 347, 517, 518, 519

[56] References Cited

U.S. PATENT DOCUMENTS

| | | | |
|---|---|---|---|
| 4,667,393 | 5/1987 | Ferla et al. | 29/576 |
| 4,937,648 | 6/1990 | Huang | 357/50 |
| 4,965,872 | 10/1990 | Vasudev | 357/35 |
| 5,327,006 | 7/1994 | Beasom | 257/257 |

OTHER PUBLICATIONS

Ifstrom et al., "A 150-V Multiple Up–Drain VDMOS, CMOS and Bipolar Process in 'Direct Bonded' Silicon on Insulator on Silicon", *IEEE Electron Device Letters*, vol. 13, No. 9, Sep. 1992, pp. 460–461.

Parke et al., "Deep Sub–Micron, Bipolar–MSO Hybrid Transistors Fabricated on Simox", *IEEE SOI Conference*, 1992.

Magnusson et al., "A Lateral Bipolar Transistor Concept on SOI Using a Self–Aligned Base Definition Technique", *Microelectronic Engineering* 15, 1991, pp. 341–344.

*Primary Examiner*—Wael Fahmy
*Attorney, Agent, or Firm*—Koppel & Jacobs

[57] ABSTRACT

A back gate bias voltage is applied to the underside of a lateral bipolar transistor to desensitize a portion of the collector-base depletion region to changes in the collector-base voltage. Emitter-collector current flows through an active base region bypassing the portion of the collector-base depletion region that remains sensitive to the collector bias. This allows for a control over the charge in the active base region by the back gate bias, generally independent of the collector-base bias. The transistor is preferably implemented in a silicon-on-insulator-on-silicon (SOIS) configuration, with the back gate bias applied to a doped silicon substrate. The base doping concentration and the thickness of the underlying insulator are preferably selected to produce an inversion layer in the base region adjacent the insulating layer, thereby reducing the collector access resistance.

2 Claims, 2 Drawing Sheets

BIPOLAR TRANSISTOR OPERATING METHOD WITH BASE CHARGE CONTROLLED BY BACK GATE BIAS

This is a continuation of application Ser. No. 08/307,296 filed on Sep. 14, 1994, now abandoned which in turn is a divisional of Ser. No. 08/088,173 filed Jul. 7, 1993, now U.S. Pat. No. 5,448,104.

BACKGROUND OF THE INVENTION

1. Field of the Invention

This invention relates to bipolar transistors, and more particularly to SOI (semiconductor-on-insulator) bipolar transistors and associated operating methods that provide for a precise control over the active base charge.

2. Description of the Related Art

A typical conventional bipolar transistor is illustrated in FIG. 1. It consists of emitter, base and collector regions 2, 4 and 6, respectively, implanted into a semiconductor substrate 8 such as silicon, with highly doped base and collector contact implants 10 and 12. An npn device is illustrated, but the following discussion also applies to pnp devices.

During operation, the p-n emitter-base and collector-base junctions are surrounded by respective depletion regions 14 and 16, whose widths are dependent upon the bias voltages across the junctions and the doping densities on either side of the junctions. The collector-base depletion region 16 normally supports the majority of the voltage across the transistor, with the emitter-collector current flowing generally as indicated by arrow 18. This depletion region experiences large variations in the bias voltage differential developed across it. Since both the collector and base regions of the transistor are normally relatively lightly doped, they undergo large variations in the incursion of the collector-base depletion region in response to variations in collector-base voltage typical of normal transistor operation. As the depletion region expands into the base region during an increase in the collector-base voltage, the width of the base region will shrink correspondingly. The base region is relatively narrow to begin with, so that such variations in the width of the depletion layer result in large variations in the amount of available base charge.

Because the collector current is inversely proportional to the amount of base charge, this modulation of the transistor's base charge has an important effect on the device's output characteristics. These characteristics include the transistor's current gain $\beta$, its early voltage $V_A$ and its punch-through breakdown voltage. In general, an increase in the base charge will reduce $\beta$ (normally undesirable), increase $V_A$ (normally desirable) and increase the punchthrough breakdown voltage (normally desirable). The development of a device with suitable performance for a specific application requires that the base charge be adjusted to give an optimum tradeoff between the various device parameters that depend upon the base charge. This typically requires that a less than optimum level be accepted for each individual parameter.

A transistor structure that is of interest for the present invention uses a silicon-on-insulator-on-silicon (SOIS) arrangement in which the transistor is fabricated in a silicon film, with an insulating oxide layer on the bottom; the oxide layer is in turn provided on the upper surface of an underlying silicon substrate. The dielectric oxide isolation eliminates a parasitic pnp transistor that can otherwise interfere with the desired transistor operation. However, the device still suffers from a dependence of the base charge upon the collector-base bias, as described above. This type of device is described in Ifstom et al., "A 150-V Multiple Up-Drain VDMOS, CMOS, and Bipolar Process in 'Direct Bonded' Silicon on Insulator on Silicon", *IEEE Electron Device Letters*, Vol. 13, No. 9, September 1992, pages 460–461.

A "hybrid" bipolar/MOS transistor that also uses an SOIS structure is disclosed in Parke et al., "Deep Sub-Micron, Bipolar-MOS Hybrid Transistors Fabricated on SIMOX," *IEEE SOI Conference*, 1992. A surface MOS device is designed so that it can support lateral bipolar transistor operation, with the surface MOS gate and the lateral bipolar base connected together. While this device has promising characteristics, there is again no disclosure of a way to prevent the base charge from varying with the collector/drain-base/gate voltage.

SUMMARY OF THE INVENTION

The present invention seeks to provide a new type of bipolar transistor and operating method that makes the active base charge substantially more independent of the collector-base bias than in previous devices, thereby making possible a greater degree of control over the transistor parameters under different operating conditions, and also improves the transistor's AC performance by reducing the base-collector resistance. The reduction in base-collector resistance is achieved without using a highly doped buried layer.

These goals are achieved by providing a contact structure on the underside of a bipolar transistor to enable the application of a back gate baas voltage. The back gate signal desensitizes, relative to the collector bias signal, the portion of the collector-base depletion region through which the majority of the emitter-collector current flows. The emitter-collector current flow through the active base region thus bypasses the portion of the base region that is sensitive to collector-base voltage changes. This allows the charge in the transistor's active base region to be controlled by means of the back gate bias, substantially independent of the collector-base voltage.

In a preferred embodiment the transistor is implemented in an SOIS configuration, with the underlying semiconductor substrate providing a contact for applying a back gate bias across an oxide layer to the underside of the base region. The base doping concentration and the thickness of the oxide layer are preferably selected to enable the establishment of an inversion layer adjacent the oxide, by the application of an appropriate back gate bias voltage. The inversion layer in effect extends the collector region under the base, and reduces the collector access resistance.

These and other features and advantages of the invention will be apparent to those skilled in the art from the following detailed description, taken together with the accompanying drawings.

DETAILED DESCRIPTION OF A PREFERRED EMBODIMENT

Figure 1:
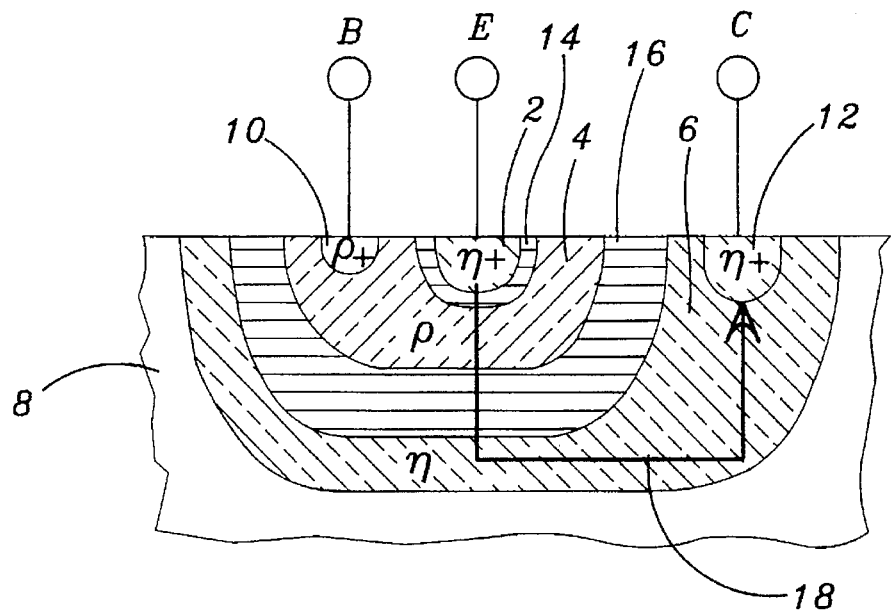
FIG. 1 is a simplified sectional view, not to scale, of a prior bipolar transistor described above.
Figure 2:
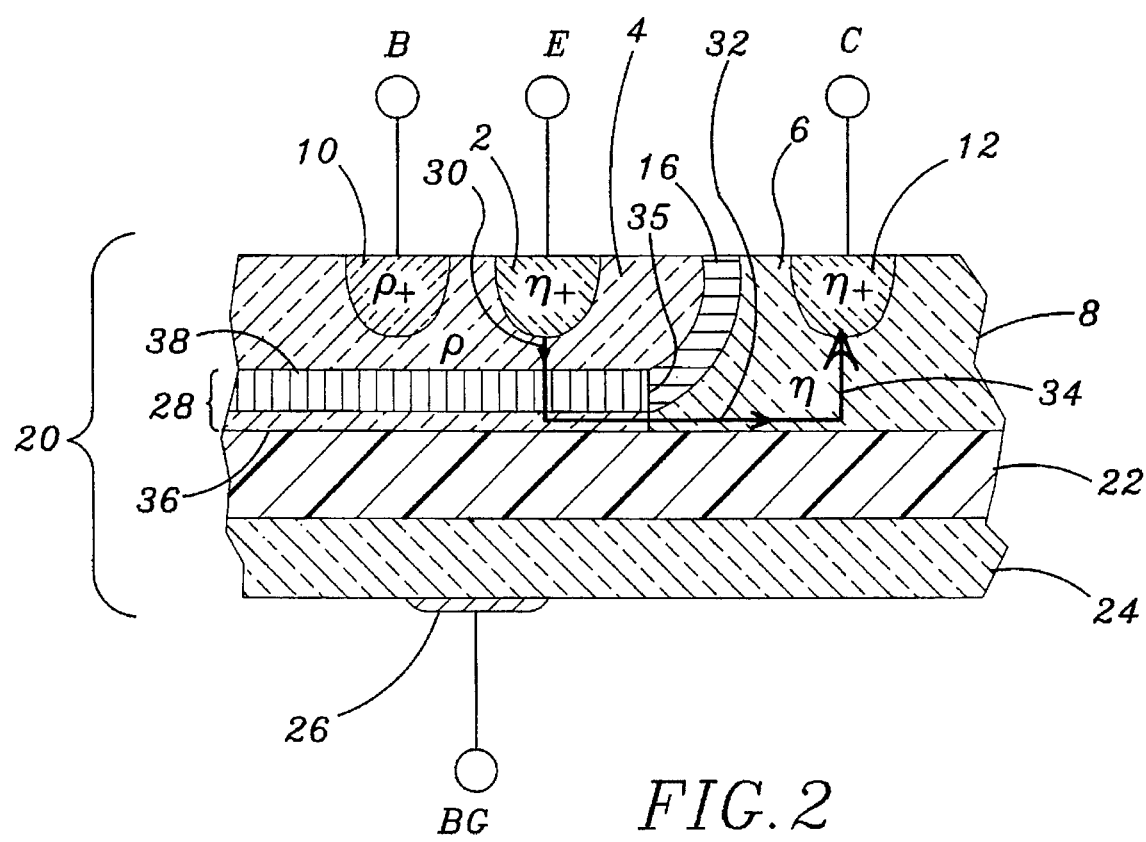
FIG. 2 is a simplified sectional view, not to scale, of a bipolar transistor in accordance with the invention.

An implementation of the invention for a simple single-base, single-collector npn bipolar transistor is illustrated in FIG. 2, in which elements that correspond to those in FIG. 1 are identified by the same reference numbers. The principles of the invention are also applicable to other known bipolar transistor configurations, such as single-base/double-collector, double-base/double-collector, and pnp. Although the device is initially intended to be implemented in silicon, the invention is also applicable to other semiconductor materials that have been found useful for transistor fabrication.

The new transistor is preferably fabricated in a conventional SOIS type of structure 20 that includes an upper silicon layer or film 8, an $SiO_2$ layer 22 below silicon layer 8, and a silicon substrate wafer 24 that supports the remainder of the structure. The drawing is not to scale; substrate 24 is much thicker than the upper layers, typically on the order of 525 micrometers.

An emitter 2, base 4 and collector 6, together with their associated contacts, are formed in the upper semiconductor layer 8 in a conventional manner, such as by initial dopant implants followed by a thermal drive-in. In accordance with the invention the substrate 24 is doped, typically with an n-type dopant to a concentration of about $10^{15}/cm^3$ for an npn device, so that it in effect establishes a contact along the underside of the buried oxide layer 22. A contact 26 is provided on the substrate to allow for the application of a back gate bias voltage. The back gate signal is insulated from the body of the transistor by the oxide layer 22, but establishes a field that depletes charge from the lower portion of the base region 4. With the emitter 2 formed in the upper portion of the base and an appropriate selection of the back gate bias, it is possible to ensure that a minimum integrated base charge path for the flow of emitter-collector current occurs between the emitter 2 and the underside of silicon layer 8 for all collector bias conditions. The portion of the collector-base depletion region through which the majority of the collector-emitter current flows is designated number 28 in the drawing; its thickness is controlled by the magnitude of the back gate bias applied at contact 26. The back gate bias could also be applied to the insulator 22 by a metallized contact structure, but an SOIS configuration is preferred.

The main current flow from the emitter to the collector follows the path of minimum integrated base charge. Since this is located immediately below the emitter, this portion of the base serves as the effective active base region. The emitter-collector current flows downward through the base, as indicated by arrow 30, to the back of silicon layer 8. It then flows along the interface with the oxide layer 22, as indicated by arrow 32, and then upward to the collector contact 12 (arrow 34). Although the current flow is illustrated for purposes of simplification as following straight lines, it of course will diffuse somewhat and not follow a perfectly straight path. However, with a proper selection of the back gate bias, the majority of the collector-emitter current will bypass the portion of the base-collector depletion region 16 that is modulated by the base-collector voltage. This means that the main current flow also bypasses the portion of the base whose charge varies with the collector-base bias. It flows instead through the active base region and through a portion of the collector-base depletion region, as established by the back gate voltage, whose width is generally independent of the collector-base bias. The transistor's parameters such as current gain β, early voltage $V_A$ and punch-through breakdown voltage are thus also generally independent of the collector-base bias, which is a considerable improvement.

It should be noted that, in contrast to the prior transistor illustrated in FIG. 1, the collector of the present device does not extend under the base region in vertical alignment with the emitter. Rather, the collector and base both extend down through the silicon layer 8 to its interface with the oxide layer 22, with a lateral boundary 35 between them.

A properly selected back gate bias in effect pins the width of the lower portion of the collector-base depletion region, making it generally independent of the collector-base bias. Since the active base region below the emitter is thus modulated primarily by the back gate bias, and only weakly by the collector-base bias, the effect of the collector bias on the active base charge is greatly attenuated. This results in a large absolute increase in the early voltage and an increase in the punchthrough breakdown voltage, and makes it possible to optimize other performance parameters such as β without the tradeoffs that have previously been required.

A further enhancement in performance can be obtained by making the back gate bias high enough so that an n-type inversion layer 36 forms in the lower portion of the collector-base depletion region 28, with the remainder of the depletion region 38 above the inversion layer. The inversion layer 36 in effect functions as an extension of the collector region 6 underneath the base region, and thus substantially reduces the device's collector resistance; this is another important parameter for good AC performance.

While the region of minimum base charge immediately below the emitter 2 is illustrated as forming abrupt junctions with the emitter and the base-collector depletion region, in practice the increase in charge from the bottom of the base to the emitter will be gradual. On the other hand, the transition from the inversion layer 36 to the remaining depletion region 38 will be quite abrupt, since the inversion layer is typically only a few tens of Angstroms thick. However, with an appropriate selection of back gate bias, base doping-concentration and thickness, the emitter-collector current will still bypass the bulk of the lateral base-collector depletion region that is sensitive to the collector-base bias.

In a specific implementation of the invention, the transistor was formed on a silicon wafer 24 that was 525 micrometers thick, with a 1 micrometer thick buried oxide layer 22 and a 5 micrometer thick silicon film 8. The emitter, base and collector contacts 2, 10 and 12 had doping concentrations of about $10^{19}/cm^3$, and extended about 1 micrometer deep into the silicon film. The p-type base 4 had a doping concentration of about $15 \times 10^{16}/cm^3$, while the n-type substrate 24 was doped to a concentration of about $10^{15}/cm^3$. With these dimensions and doping levels, back gate signals in the approximate range of 10–100 volts will yield satisfactory transistor operation, with the emitter-collector current bypassing the bulk of the collector-base depletion region that is sensitive to the collector-base bias, and an inversion layer 36 forming adjacent the insulator 22.

The back gate voltage should be chosen so that, for all processing variations, an inversion layer will form above the buried oxide layer. For the device dimensions described above, the threshold back gate voltage above which an inversion layer will typically form ranges from about 2–8 volts.

For a smaller device intended for higher frequency operation with a capability for a higher packing density and greater degree of integration, the silicon film 8 can be reduced to the order of 0.2 micrometers thick, with the oxide layer 22 also on the order of 0.2 micrometers thick. In this case the emitter, base and collector contacts 2, 10 and 12 can extend about 0.1 micrometers into the silicon film, with the same doping density of $10^{19}/cm^3$ as before. The dopant concentration for the p-type base region 4 is increased to about $3\times10^{17}/cm^3$, while the dopant concentration for the silicon wafer 24 remains at about $10^{15}/cm^3$. With this configuration, proper transistor action is achieved with a back gate voltage on the order of approximately 5–30 volts. Simulations indicate that the threshold back gate voltage for an inversion layer to form is about 0+–4 volts.

Figure 3A:
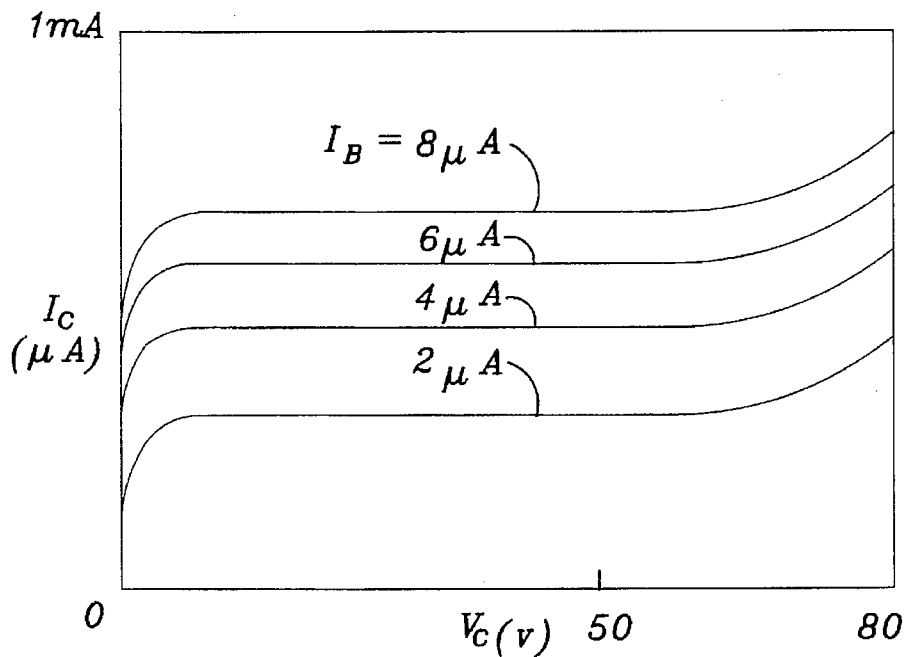
FIGS. 3a and 3b are graphs of collector current as a function of collector voltage and base current, for two base-collector spacings.
Figure 3B:
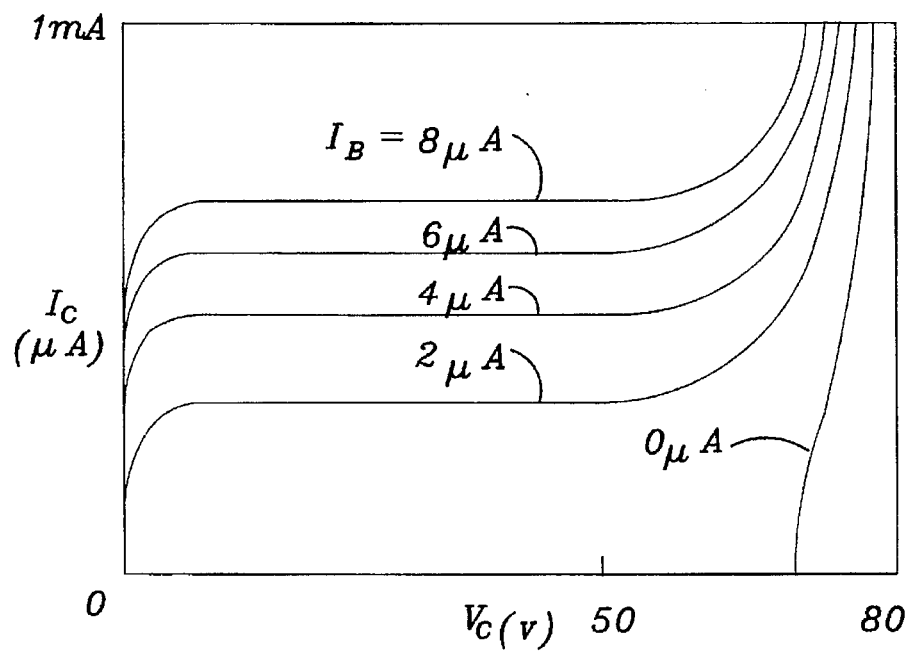

FIG. 3a shows the relationship between collector current and collector voltage for a transistor having the first set of dimensions and doping concentrations stated above. Current-voltage curves are given for base currents ranging from 0 to 8 microamps, a spacing between the base and collector contacts of 5 micrometers, and a 7 volt back gate bias signal. FIG. 3b is a plot of the same parameters when the spacing between the base and collector contacts is increase to 10 micrometers. It can be seen that the collector current response is substantially independent of the collector bias over a wide range, extending up to about 65 volts for FIG. 3a and to about 55 volts for FIG. 3b. These transistors would experience a collector current modulation at significantly lower levels of collector bias in the absence of the back gate signal.

While particular embodiments of the invention have been shown and described, numerous variations and alternate embodiments will occur to those skilled in the art. Accordingly, it is intended that the invention be limited only in terms of the appended claims.

I claim:

1. A method of operating a bipolar transistor that includes an emitter region, a collector region spaced laterally from the emitter region, and a base region that underlies the emitter region and extends between the emitter and collector regions with a boundary between the base and collector regions that is laterally offset from the emitter region, comprising:

applying operating signals to said emitter, collector and base regions to establish a base-collector depletion region, and an emitter-collector current flow, and applying, through a nonconductive substrate which directly underlies both said base and collector regions, a back gate bias voltage to the underside of said base region of a polarity and magnitude to repel base dopant, establish an inversion layer in the base region adjacent its underside which effectively functions as an extension of the collector region, and establish a depletion region in the base region as a continuation of said base-collector depletion region immediately above said inversion layer, so that the transistor's emitter-collector current flows through said continuation of the base-collector depletion region and through said inversion layer and is substantially independent of the transistor's collector-base voltage over a substantial collector-base voltage operating range.

2. The method of claim 1, wherein said emitter-collector current flows through an active region of said base region, and said back gate bias voltage controls the charge in the active base region generally independent of the collector operating signal.

* * * * *